(12) United States Patent
Liu

(10) Patent No.: US 10,651,312 B2
(45) Date of Patent: May 12, 2020

(54) FLEXIBLE THIN FILM TRANSISTOR AND METHOD FOR FABRICATING THE SAME

(71) Applicant: Shenzhen China Star Optoelectronics Semiconductor Display Technology Co., Ltd., Shenzhen, Guangdong (CN)

(72) Inventor: Xiang Liu, Guangdong (CN)

(73) Assignee: SHENZHEN CHINA STAR OPTOELECTRONICS SEMICONDUCTOR DISPLAY TECHNOLOGY CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 15/575,204

(22) PCT Filed: Jun. 22, 2017

(86) PCT No.: PCT/CN2017/089615
§ 371 (c)(1),
(2) Date: Nov. 17, 2017

(87) PCT Pub. No.: WO2018/209757
PCT Pub. Date: Nov. 22, 2018

(65) Prior Publication Data
US 2018/0337286 A1   Nov. 22, 2018

(30) Foreign Application Priority Data
May 16, 2017 (CN) .......................... 2017 1 0344614

(51) Int. Cl.
*H01L 29/786* (2006.01)
*H01L 29/66* (2006.01)
*H01L 29/423* (2006.01)

(52) U.S. Cl.
CPC .. *H01L 29/78603* (2013.01); *H01L 29/42376* (2013.01); *H01L 29/66742* (2013.01)

(58) Field of Classification Search
CPC ......... H01L 29/78603; H01L 29/42376; H01L 29/66742
See application file for complete search history.

(56) References Cited

U.S. PATENT DOCUMENTS

| | | | |
|---|---|---|---|
| 2004/0155245 A1 | 8/2004 | Okumura | |
| 2005/0230685 A1 | 10/2005 | Oishi et al. | |
| 2006/0163559 A1 | 7/2006 | Koganei et al. | |
| 2006/0166411 A1* | 7/2006 | Morisue | H01L 27/14621 438/149 |

FOREIGN PATENT DOCUMENTS

| | | |
|---|---|---|
| CN | 1521858 A | 8/2004 |
| CN | 1684273 A | 10/2005 |
| CN | 1768437 A | 5/2006 |
| CN | 101989618 A | 3/2011 |
| CN | 103413833 A | 11/2013 |
| CN | 105304719 A | 2/2016 |
| JP | 2003007721 A | 1/2003 |

* cited by examiner

*Primary Examiner* — Seahvosh Nikmanesh

(57) ABSTRACT

A flexible thin film transistor and a method for fabricating the same are provided. The flexible thin film transistor has: a flexible substrate; an inorganic insulating layer disposed on the flexible substrate; and a thin film transistor disposed on the inorganic insulating layer. A rough structure is formed on a side surface of the inorganic insulating layer facing toward the thin film transistor.

8 Claims, 1 Drawing Sheet

FLEXIBLE THIN FILM TRANSISTOR AND METHOD FOR FABRICATING THE SAME

FIELD OF THE DISCLOSURE

The present disclosure relates to the technical field of displays, and more particularly to a flexible thin film transistor and a method for fabricating the same.

BACKGROUND OF THE DISCLOSURE

Flexible thin film transistors are widely used in a variety of large, medium, and small size products due to having the advantages of being thin, light weight, having low power consumption, being flexible, resistant to impact, and so on, which relate to almost all main electronic products in the current information society, such as: mobile phones, vehicle displays, e-books, etc., and have very broad application prospects.

However, a thin film transistor is generally directly formed on a flexible substrate during the fabrication of a conventional flexible thin film transistor. The flexible substrate is usually formed of polyethylene terephthalate (PET), polyethylene naphthalate (PEN), polyethersulfone resin (PES), polyimide (PI), etc., and the thin film transistor is usually formed by depositing a transparent conductive thin film. The flexible substrate, while being bent, is easily separated from the transparent conductive thin film, causing poor display quality, due to poor adhesion of the transparent conductive film to the flexible substrate. Further, the flexible substrate has poor water-vapor barrier ability, and external air and water vapor can easily penetrate a device through the flexible substrate, so as to affect properties of the device directly and deteriorate the properties of the device.

As a result, it is necessary to provide a flexible thin film transistor and a method for fabricating the same to solve the problems existing in the conventional technologies.

SUMMARY OF THE DISCLOSURE

An object of the present disclosure is to provide a flexible thin film and a method for fabricating the same, which can keep a thin film transistor from easily separating from the flexible substrate, so as to improve the display quality of a device and effectively improve the water-vapor barrier performance of the device.

The present disclosure provides a flexible thin film transistor, comprising:
  a flexible substrate;
  an inorganic insulating layer disposed on the flexible substrate; and
  a thin film transistor disposed on the inorganic insulating layer,
  wherein a rough structure is formed on a side surface of the inorganic insulating layer facing toward the thin film transistor;
  wherein a thickness of the inorganic insulating layer ranges from 3000 Å to 8000 Å; and
  wherein the inorganic insulating layer is formed of oxides, nitrides, or nitrogen oxides.

In the flexible thin film transistor of the present disclosure, the rough structure is distributed discontinuously on the side surface of the inorganic insulating layer facing toward the thin film transistor.

In the flexible thin film transistor of the present disclosure, the rough structure is formed by performing plasma etching on the side surface of the inorganic insulating layer facing toward the thin film transistor.

In the flexible thin film transistor of the present disclosure, the rough structure is rough and contacts with the thin film transistor.

The present disclosure further provides a flexible thin film transistor, comprising:
  a flexible substrate;
  an inorganic insulating layer disposed on the flexible substrate; and
  a thin film transistor disposed on the inorganic insulating layer,
  wherein a rough structure is formed on a side surface of the inorganic insulating layer facing toward the thin film transistor.

In the flexible thin film transistor of the present disclosure, a thickness of the inorganic insulating layer ranges from 3000 Å to 8000 Å.

In the flexible thin film transistor of the present disclosure, the inorganic insulating layer is formed of oxides, nitrides, or nitrogen oxides.

In the flexible thin film transistor of the present disclosure, the rough structure is distributed discontinuously on the side surface of the inorganic insulating layer facing toward the thin film transistor.

In the flexible thin film transistor of the present disclosure, the rough structure is formed by performing plasma etching on the side surface of the inorganic insulating layer facing toward the thin film transistor.

In the flexible thin film transistor of the present disclosure, the rough structure is rough and contacts with the thin film transistor.

According to the above object of the present disclosure, a method for fabricating a flexible thin film transistor is further provided, which comprises steps of:
  a flexible substrate;
  forming an inorganic insulating layer on the flexible substrate;
  performing a roughening treatment on a side surface of the inorganic insulating layer to form a rough structure; and
  forming a thin film transistor on the inorganic insulating layer.

In the method for fabricating the flexible thin film transistor, the rough structure is distributed discontinuously on the side surface of the inorganic insulating layer facing toward the thin film transistor.

In the method for fabricating the flexible thin film transistor, the rough structure is formed by performing plasma etching on the side surface of the inorganic insulating layer facing toward the thin film transistor.

In the method for fabricating the flexible thin film transistor, the rough structure is rough and contacts with the thin film transistor.

In the flexible thin film transistor and the method for fabricating the same of the present disclosure, the inorganic insulating layer is disposed on the flexible substrate, and the rough structure is formed on a side surface of the inorganic insulating layer facing toward the thin film transistor, so as to keep a thin film transistor from easily separating from the flexible substrate, thereby improving the display quality of a device and effectively improving the water-vapor barrier performance of the device.

To make the above description of the present disclosure more clearly comprehensible, it is described in detail below in examples of preferred embodiments with the accompanying drawings.

DESCRIPTION OF THE DRAWINGS

The technical solutions and other advantageous effects of the present disclosure will be apparent from the following detailed description of specific embodiments of the disclosure taken in conjunction with the accompanying drawings.

DETAILED DESCRIPTION OF THE PREFERRED EMBODIMENTS

In order to further illustrate the technical means and the effects of the present disclosure, the following will be described in detail with reference to the preferred embodiments of the present disclosure and its accompanying drawings. Apparently, the described embodiments are merely part of the present disclosure, and are not all embodiments. All other embodiments obtained by those of ordinary skill in the art, based on the embodiments in the present disclosure, without making creative work are within the scope of the present disclosure.

Figure 1:
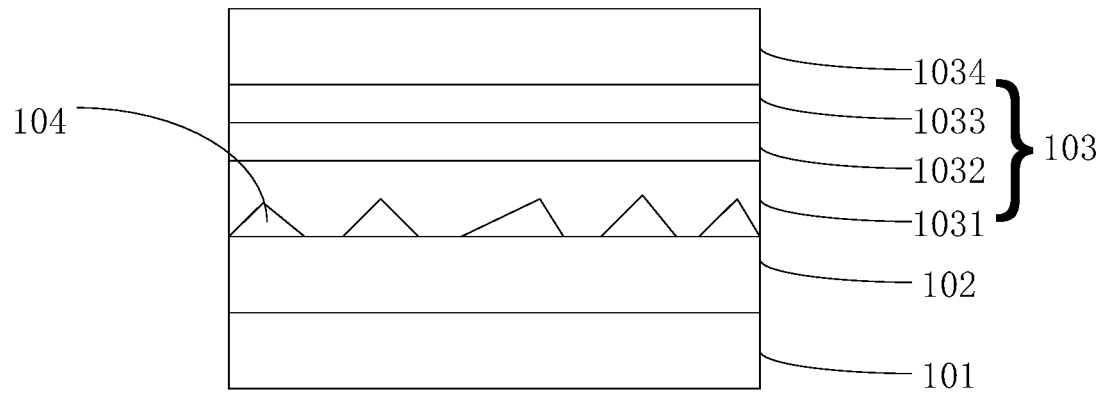
FIG. 1 is a structural schematic diagram of a flexible thin film transistor provided by a preferred embodiment of the present disclosure.

Refer to FIG. 1, which is a structural schematic diagram of a flexible thin film transistor provided by a preferred embodiment of the present disclosure. As shown in FIG. 1, the flexible thin film transistor comprises: a flexible substrate 101; an inorganic insulating layer 102 disposed on the flexible substrate 101; and a thin film transistor 103 disposed on the inorganic insulating layer 102, wherein a rough structure 104 is formed on a side surface of the inorganic insulating layer 102 facing toward the thin film transistor 103. In the present disclosure, the inorganic insulating layer 102 is disposed between the flexible substrate 101 and the thin film transistor 103, and the rough structure 104 is formed on the side surface of the inorganic insulating layer 102 facing toward the thin film transistor 103, so as to keep the thin film transistor 103 from easily separating from the inorganic insulating layer 102, thereby improving display quality of a device.

It should be noted that the thin film transistor 103 in the flexible thin film transistor provided by the present preferred embodiment comprises: a gate electrode 1031, a gate insulating layer 1032, a conductive channel 1033 and a source/drain electrode 1034, which are disposed on the inorganic insulating layer 102 in sequence. In general, a step of forming the gate electrode 1031 is as follows: a layer of transparent conductive thin film is deposited on the inorganic insulating layer 102; and then, the gate electrode 1031 is formed by a patterning process. During the patterning process, the inorganic insulating layer 102 located below the transparent conductive thin film protects the flexible substrate 101, so as to prevent the flexible substrate 101 from being damaged due to presence of process errors. Further, external water-vapor cannot easily penetrate into the device through the flexible substrate 101 due to the inorganic insulating layer 102, and thus improving the device.

The inorganic insulating layer 102 in the present preferred embodiment is further described below.

A thickness of the inorganic insulating layer 102 ranges from 3000 Å to 8000 Å. It is to be noted that the thickness of the inorganic insulating layer 102 can be adjusted according to actual situations. However, when the thickness of the inorganic insulating layer 102 is adjusted, it should be considered that a rough structure 104 needs to be formed on a side surface of the inorganic insulating layer 102 by a processing treatment, after the inorganic insulating layer 102 is formed on the flexible substrate 101. In other words, adjustment of the thickness of the inorganic insulating layer 102 should be ensured so as not to damage the flexible substrate 101 when the rough structure 104 is formed by the process treatment.

The inorganic insulating layer 102 is formed of oxides, nitrides, or nitrogen oxides. The inorganic insulating layer 102 has a relatively good adhesion to the flexible substrate 101 and does not cause separation due to bending of the device. In the preferred embodiment, the flexible substrate 101 is usually formed of polyethylene terephthalate (PET), polyethylene naphthalate (PEN), polyethersulfone resin (PES), fiber reinforced-composite plastics (FRP), etc. These materials all have relative good adhesions to the inorganic insulating layer 102, which can keep the inorganic insulating layer 102 deposited on the flexible substrate 101 from easily separating from the flexible substrate 101.

The rough structure 104 on the inorganic insulating layer 102 in the present preferred embodiment is further described below.

In order to further improve the efficiency, the rough structure 104 on the inorganic insulating layer 102 in the present preferred embodiment is distributed discontinuously on the side surface of the inorganic insulating layer 102 toward the thin film transistor 103. Specifically, in the present preferred embodiment, after forming the inorganic insulating layer 102, the rough structure 104 is formed by performing plasma etching on the side surface of the inorganic insulating layer 102 facing toward the thin film transistor 103. It should be noted that, the rough structure 104 is distributed discontinuously on the side surface of the inorganic insulating layer 102 facing toward the thin film transistor 103, which can also keep the thin film transistor 103 from easily separating from the inorganic insulating layer 102.

In particular, the rough structure 104 is rough and contacts with the thin film transistor 103.

In the flexible thin film transistor of the present preferred embodiment, the inorganic insulating layer is disposed on the flexible substrate, and the rough structure is formed on the side surface of the inorganic insulating layer facing toward the thin film transistor, so as to keep the thin film transistor from easily separating from the flexible substrate, thereby improving the display quality of a device and effectively improving the water-vapor barrier performance of the device.

Figure 2:
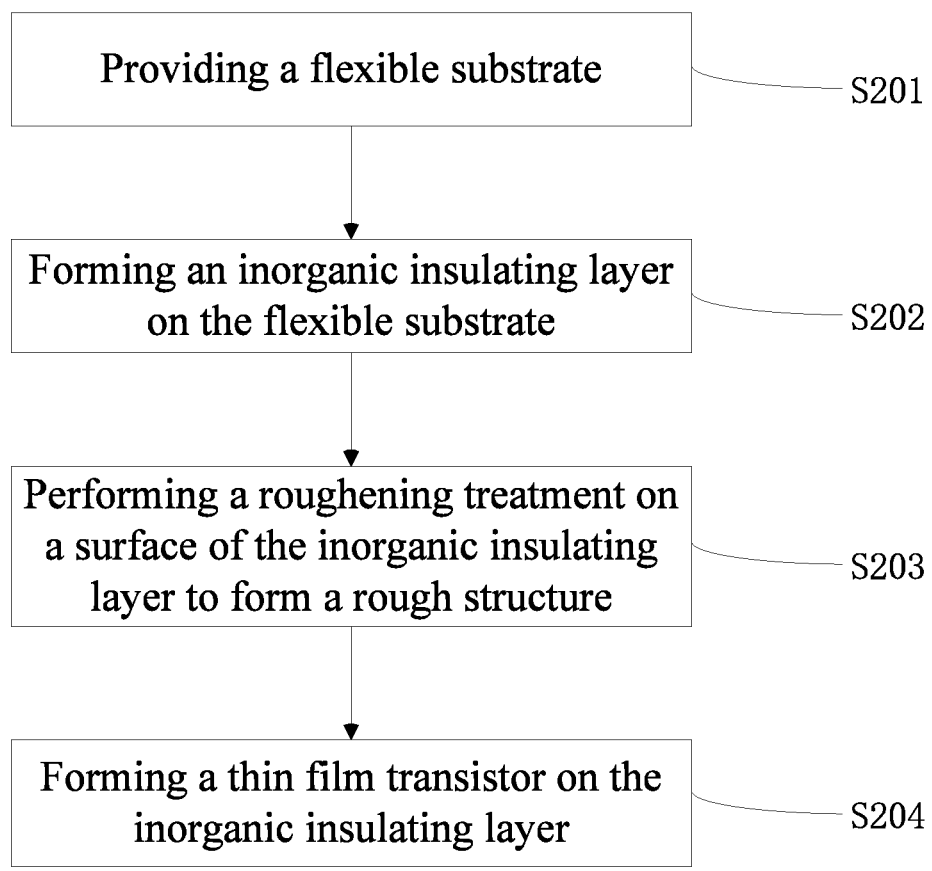
FIG. 2 is a flowchart of a method for fabricating a flexible thin film transistor provided by a preferred embodiment of the present disclosure.

Refer to FIG. 2, which is a flowchart of a method for fabricating a flexible thin film transistor provided by a preferred embodiment of the present disclosure. As shown in FIG. 2, the present disclosure further provides a method for fabricating a flexible thin film transistor, comprising steps of:

Step S201: providing a flexible substrate;

Step S202: forming an inorganic insulating layer on the flexible substrate;

Step S203: performing a roughening treatment on a side surface of the inorganic insulating layer to form a rough structure; and Step S204: forming a thin film transistor on the inorganic insulating layer.

In the step S201, the flexible substrate is usually formed of polyethylene terephthalate (PET), polyethylene naphthalate (PEN), polyethersulfone resin (PES), fiber reinforced-composite plastics (FRP), etc. These materials all have relatively good adhesions to the inorganic insulating layer, which can keep the inorganic insulating layer deposited on the flexible substrate 101 from easily separating from the flexible substrate.

In the step S202, a thickness of the inorganic insulating layer ranges from 3000 Å to 8000 Å. It is to be noted that the thickness of the inorganic insulating layer 102 can be adjusted according to an actual situation. However, when the thickness of the inorganic insulating layer is adjusted, it should be considered that: a rough structure is required to be formed on a side surface of the inorganic insulating layer by a processing treatment, after the inorganic insulating layer is formed on the flexible substrate. In other words, the adjustment of the thickness of the inorganic insulating layer should be ensured so as not to damage the flexible substrate when the rough structure is formed by the process treatment.

Further, the inorganic insulating layer is formed of oxides, nitrides, or nitrogen oxides. The inorganic insulating layer 102 has a relatively good adhesion to the flexible substrate 101 and does not cause separation due to bending of the device.

In the step S203, the rough structure is formed by performing plasma etching on the side surface of the inorganic insulating layer facing toward the thin film transistor. It should be noted that, the rough structure is distributed discontinuously on the side surface of the inorganic insulating layer facing toward the thin film transistor, which can also keep the thin film transistor from easily separating from the inorganic insulating layer. In particular, the rough structure is rough and contacts with the thin film transistor.

In the step S204, a thin film transistor is formed on the inorganic insulating layer. Specifically, a gate electrode, a gate insulating layer, a conductive channel, and a source/drain electrode are formed on the inorganic insulating layer in sequence.

In general, a step of forming the gate electrode is as follows: depositing a layer of transparent conductive thin film on the inorganic insulating layer; and then, forming the gate electrode by a patterning process. During the patterning process, the inorganic insulating layer located below the transparent conductive thin film has a protection on the flexible substrate, so as to prevent the flexible substrate from being damaged due to presence of process errors. Further, external water-vapor cannot easily penetrate into the device through the flexible substrate due to existence of the inorganic insulating layer, and thus the device is improved.

In the flexible thin film transistor and the method for fabricating the same of the present disclosure, the inorganic insulating layer is disposed on the flexible substrate, and the rough structure is formed on a side surface of the inorganic insulating layer facing toward the thin film transistor, so as to keep a thin film transistor from easily separating from the flexible substrate, thereby improving the display quality of a device and effectively improving the water-vapor barrier performance of the device.

As described above, although the present disclosure has been described in preferred embodiments, they are not intended to limit the disclosure. One of ordinary skill in the art, without departing from the spirit and scope of the disclosure within, can make various modifications and variations, so the range of the scope of the disclosure is defined by the claims.

What is claimed is:

1. A flexible thin film transistor, comprising:
    a flexible substrate;
    an inorganic insulating layer disposed on the flexible substrate; and
    a thin film transistor disposed on the inorganic insulating layer,
    wherein a side surface of the inorganic insulating layer has a rough surface facing toward the thin film transistor;
    wherein a thickness of the inorganic insulating layer ranges from 3000 Å to 8000 Å; and
    wherein the inorganic insulating layer is formed of oxides, nitrides, or nitrogen oxides.

2. The flexible thin film transistor according to claim 1, wherein the rough surface is distributed discontinuously on the side surface of the inorganic insulating layer facing toward the thin film transistor.

3. The flexible thin film transistor according to claim 2, wherein the rough surface comprises a plasma etched region on the side surface of the inorganic insulating layer facing toward the thin film transistor.

4. The flexible thin film transistor according to claim 1, wherein the rough surface contacts with the thin film transistor.

5. A flexible thin film transistor, comprising:
    a flexible substrate;
    an inorganic insulating layer disposed on the flexible substrate; and
    a thin film transistor disposed on the inorganic insulating layer,
    wherein a rough surface is formed on a side surface of the inorganic insulating layer facing toward the thin film transistor, and
    wherein a thickness of the inorganic insulating layer ranges from 3000 Å to 8000 Å.

6. The flexible thin film transistor according to claim 5, wherein the rough surface is distributed discontinuously on the side surface of the inorganic insulating layer facing toward the thin film transistor.

7. The flexible thin film transistor according to claim 6, wherein the rough surface comprises a plasma etched region on the side surface of the inorganic insulating layer facing toward the thin film transistor.

8. The flexible thin film transistor according to claim 5, wherein the rough surface contacts with the thin film transistor.

* * * * *